United States Patent [19]

Tindall et al.

[11] Patent Number: 4,487,461
[45] Date of Patent: Dec. 11, 1984

[54] RACK MOUNTING SYSTEM

[75] Inventors: Richard F. Tindall, Wolstanton; Leslie Marshall, Macclesfield; Stephen Hurlin, Sandbach, all of England

[73] Assignee: VG Instruments Group Limited, West Sussex, United Kingdom

[21] Appl. No.: 477,957

[22] Filed: Mar. 23, 1983

[30] Foreign Application Priority Data

Mar. 25, 1982 [GB] United Kingdom ............... 8208808

[51] Int. Cl.³ .................. A47B 88/06; A47B 88/18
[52] U.S. Cl. ................................. 312/323; 312/322; 312/350
[58] Field of Search ............... 312/24, 25, 270, 323, 312/322, 350, 320, 313, 120; 248/558, 225.1, 242, 243; 108/5

[56] References Cited

U.S. PATENT DOCUMENTS

| 651,739 | 6/1900 | Woodruff | 312/323 |
|---|---|---|---|
| 731,654 | 6/1903 | Bankmann | 312/323 |
| 2,486,764 | 11/1949 | Singer | 312/323 UX |
| 2,749,201 | 6/1956 | Koury et al. | 312/350 |
| 2,752,219 | 6/1956 | Yonkers | 312/350 |
| 2,867,489 | 1/1959 | Medow | 312/323 |
| 2,869,958 | 1/1959 | Hough | 312/323 |
| 2,897,033 | 7/1959 | Ford | 312/320 |
| 3,146,048 | 8/1964 | Graham et al. | 312/323 |
| 3,148,007 | 9/1964 | Bertrand | 312/323 |
| 3,975,071 | 8/1976 | Quinn | 312/323 |

Primary Examiner—William E. Lyddane
Assistant Examiner—Thomas A. Rendos
Attorney, Agent, or Firm—Birch, Stewart, Kolasch & Birch

[57] ABSTRACT

A rack mounting system for securing electrical apparatus to a pair of telescopic slides or the like, comprising a pair of rigid elongated support plates forming part of or attached to the sliding members of the telescopic slides, said support plates being provided with a plurality of slots and notches opening into the upper edge of the plate, and positioned in such a way as to simultaneously receive and locate two out of a plurality of pins, pulleys or rollers carried by said electrical apparatus and said notches, slots and pins, pulleys or rollers being positioned so as to allow the said apparatus to be positioned in a plurality of orientations on said support plates once the telescopic slides have been extended, and maintained in these orientations through the action of gravity so that the apparatus can only be moved from the selected orientation by a deliberate lifting action, thereby improving access to the apparatus while it remains on the telescopic slides, but allowing the easy removal of the apparatus from the slides in at least one of the orientations simply by lifting the said pins or the like out of the said slots and notches.

6 Claims, 11 Drawing Figures

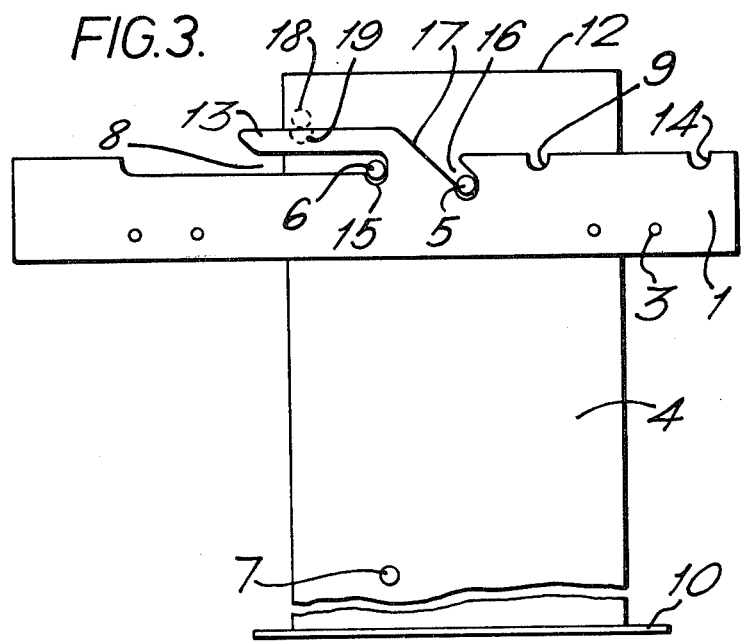
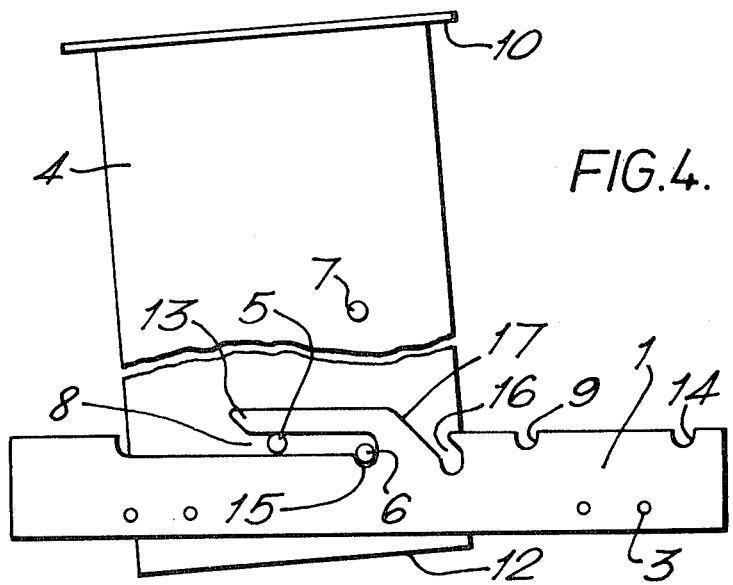

RACK MOUNTING SYSTEM

This invention relates to the mounting of chassis or cases of electrical or electronic equipment in racks or larger cabinets, usually on telescopic slides or runners which allow the apparatus to be withdrawn from the rack for servicing.

The use of telescopic runners or slides, for example those described in U.S. Pat. No. 3,771,849, whilst facilitating the withdrawal of the apparatus from the rack, does not allow unrestricted access to the apparatus because the orientation of the apparatus relative to the rack remains unchanged. Furthermore, unless expensive and complicated telescopic slides containing more than two sliding members are used, the apparatus cannot be withdrawn completely clear of the rack to allow easy access to its rear panel unless the apparatus case is significantly shorter than the depth of the rack, which is clearly wasteful of space in the rack. One way of overcoming these difficulties, whilst using only simple telescopic runners is described in UK patent specification No. 587,598, which discloses the horizontal slotting of the sides of a chassis and the mounting of the chassis on the slides by means of a pair of locating pins attached to the slides which engage with the slots in the chassis sides. This allows the chassis to be moved forward on the locating pins once the slides have been fully extended, and allows easy access to the rear of the apparatus. By means of a suitable shaping of the pins and slots, and the provision of a pair of locking catches, the chassis is made to pivot on the slides when it is withdrawn fully, so that it hangs with its front panel uppermost and horizontal, which permits easier access to the underside of the unit.

Another approach involves the mounting of the apparatus on fixed pivots on the telescopic slides and locking it in position in various orientations with ratchet and pawl devices, e.g. as disclosed in UK patent specification No. 902,045. This method does not improve access to the rear of the unit when it is horizontal, however, although it does permit the apparatus to be locked in many different orientations on the slides. Clearly, pivots associated with any locking device can also be used. The provision of pivots of any description, however, usually makes it difficult to completely remove the chassis from the slides because this will require the dismantling of the pivot assembly.

This problem detracts from the usefulness of telescopic slides in general, because it is frequently necessary to remove an item of equipment from the rack, for example to replace it with another item whilst a fault on the original equipment is corrected elsewhere. It is also often necessary to withdraw the apparatus so that its rear panel is well clear of the rack, for example to carry out adjustments whilst the equipment remains connected to the rack, and this is impossible with the simple pivoting systems, unless multiple telescopic slides are used. It is not usually necessary, however, to provide a large number of different orientations for the apparatus on the slides, and for most applications only one or two are needed. However, it is important that the apparatus is held securely in these positions whilst servicing or adjustments are carried out.

It is the object of the present invention to provide a simple method of mounting electrical apparatus on telescopic slides or the like, in such a way that the apparatus can easily be removed from the slides when necessary, or can be moved forward beyond the maximum extension of the slides to give improved access to its rear, or can be positioned in one of several orientations on the slides to allow easy access to its top or bottom.

In accordance with this objective, there is provided a rack mounting system for securing electrical apparatus to a pair of telescopic slides or the like, comprising a pair of rigid elongated support plates forming part of or attached to the sliding members of the telescopic slides, said support plates being provided with a plurality of slots and notches opening into the upper edge of the plate, and positioned in such a way as to simultaneously receive and locate two out of a plurality of pins, pulleys or rollers carried by said electrical apparatus and said notches, slots and pins, pulleys or rollers being positioned so as to allow the said apparatus to be positioned in a plurality of orientations on said support plates once the telescopic slides have been extended, and maintained in these orientations through the action of gravity so that the apparatus can only be moved from the selected orientation by a deliberate lifting action, thereby improving access to the apparatus whilst it remains on the telescopic slides, but allowing the easy removal of the apparatus from the slides in at least one of the orientations simply by lifting the said pins or the like out of the said slots and notches.

The said bearing pins may be further provided with flanges in order to prevent the said support plates from moving away from the said electrical apparatus which would allow the apparatus to fall between the support plates. By this means, the need for a framework to hold the support plates in the proper position is eliminated. Furthermore, the positions of the said pins and said notches and slots are arranged so that the various orientations of the apparatus can be obtained in sequence simply by lifting the front of the apparatus case so that it remains supported on only one pair of pins, and then moving it so that these pins slide along an edge of the support plate into the next desired location, so that there is no need to lift the apparatus off the support plates to change its orientation.

The pins may be carried by a framework of the electrical apparatus or by brackets, but preferably the apparatus is provided with side plates and the pins are mounted on the side plates.

A possible embodiment of the invention will now be described in more detail by way of example and with reference to the accompanying drawings, in which:

FIGS. 2, 3 and 4 are similar views showing three possible positions of the apparatus case on the support plates when the slides have been extended;

Figure 5A:
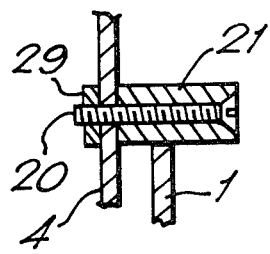
Figure 6:
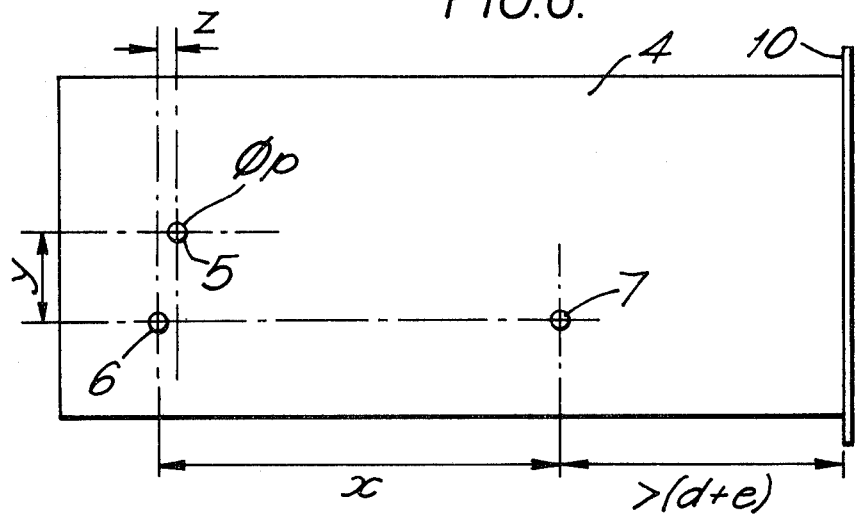
Figure 7:
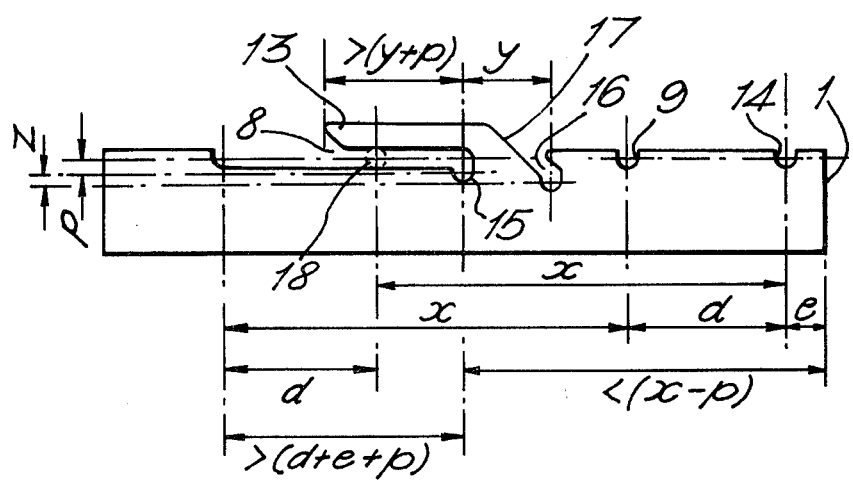

FIGS. 5A, B, C, D and E show different forms of construction of pins suitable for use in the invention; and FIGS. 6 and 7 give the essential relationships between the positions of the pins and notches which are required for the proper operation of this embodiment.

Figure 1:
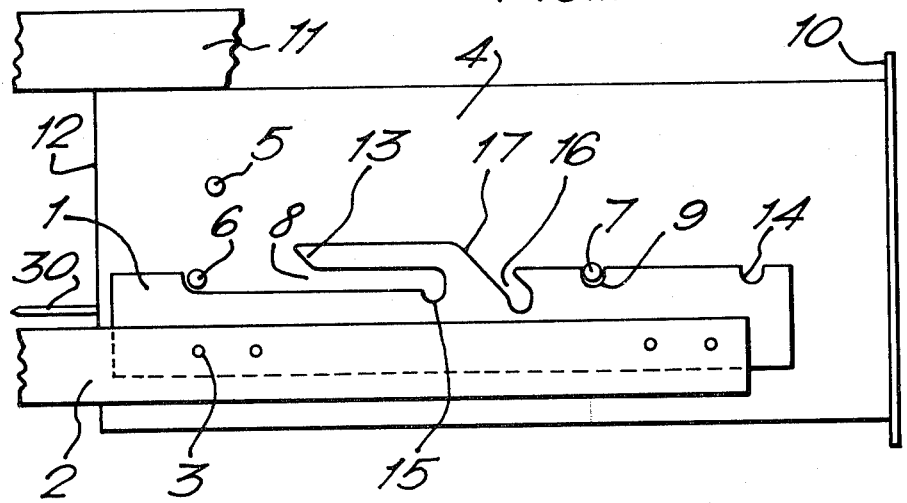
FIG. 1 is a side elevation showing the position of the apparatus case on the support plates when it is inserted in the mounting rack.

Referring first to FIG. 1, an elongated support plate 1 is attached to the sliding member of a telescopic slide 2 by means of four countersunk head screws in holes 3. Slide 2 may be of any known type, but those which can be locked in their fully extended position are particularly suitable. A plate-like member 4 either forms the side of the case of the apparatus or is attached to it, and carries three bearing pins 5, 6 and 7. The front of the apparatus is indicated by 10. A similar arrangement is provided on the other side of the apparatus case. In its normal position on the slides, the apparatus case is supported on pins 6 and 7 which locate at the end of slot 8 and in notch 9 respectively. The apparatus case can be withdrawn from, or inserted into the rack on the telescopic slides 2 by means of handles on front panel 10, because the location of pin 7 in notch 9 prevents relative movement in this direction between support plate 1 and plate 4.

The weight of the apparatus case maintains pins 6 and 7 in slot 8 and notch 9. When the unit is in position in the rack, the front panel 10 is secured to the rack by releasable devices such as stout screws or catches. The rear panel 12 of the apparatus case carries a number of dowels 30 which locate in suitable sockets fixed in the rear of the rack. These prevent the apparatus from being dislodged from its mountings on the support plates by shock or vibration. In order to eliminate the risk of pins or pulleys shearing off under extreme conditions, the front panel securing screws and the sockets for dowels 30 are positioned so that the apparatus is lifted slightly higher when it is secured in the rack than its rest position on support plates 1. Thus, pins 5, 6 and 7 are relieved of the weight of the apparatus case when it is in the rack, and reduces the chance of damage by shock and the risk of the pins shearing off under extreme conditions is obviated.

Alternatively, for less demanding applications, a simple guide 11 may be fitted in the rack above the upper edge of plate 4, to ensure that pin 6 cannot lift out of slot 8. It might conveniently form part of the telescopic slide assembly used for mounting another piece of apparatus above the one indicated. In many cases, however, especially where the equipment rack is fixed in position, neither dowels 30 nor guide 11 are necessary.

Figure 2:
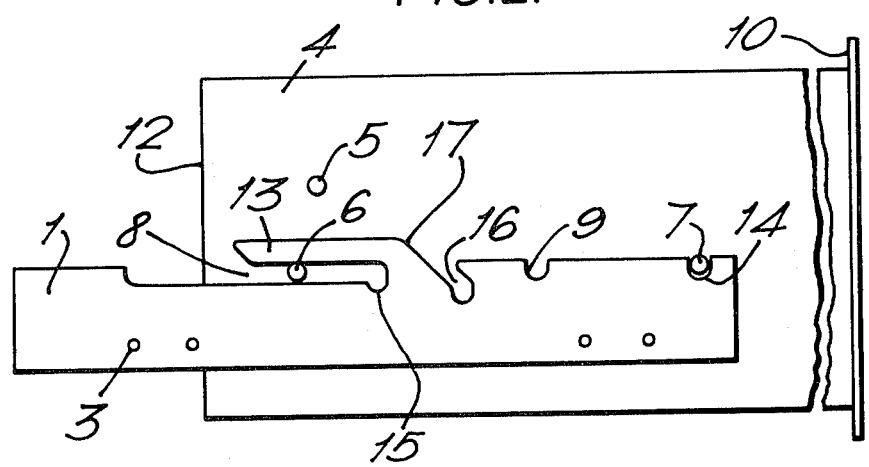

In order to service the apparatus, the devices securing the front panel are released and the apparatus is withdrawn from the rack using the handles on panel 10. If the apparatus is to be removed from the rack, it may then be lifted clear of the supports 1, as can be seen from FIG. 1. However, if this is not done, the rear of the apparatus case 12 will occupy approximately the same position that the front panel 10 did before the apparatus case was withdrawn. Access to the rear panel 12 can be improved by lifting front panel 10 so that pin 7 is lifted out of notch 9 and drawing the apparatus forward so that pin 6 slides along the bottom of slot 8 under tongue 13, and pin 7 locates in notch 14. This position is illustrated in FIG. 2, in which the telescopic slides 2 are omitted for clarity. In this position, pin 6 is located under tongue 13, preventing the rear of the apparatus case being lifted out of slot 8 and improving the security of the mounting.

In order to gain access to the top of the unit, the front panel 10 is again lifted so that pin 7 is clear of notch 14, and the apparatus case pulled further forward until pin 6 locates in notch 15 at the end of slot 8. The front of the apparatus case can then be lowered so that it takes up the orientation shown in FIG. 3, and pin 5 enters slot 16 preventing further movement. The rear panel 12 is then uppermost.

To gain access to the underside of the apparatus case, the front panel 10 is lifted so that pin 5 leaves slot 16 and runs along the edge 17 to take up an intermediate position 18 (FIG. 3). The front panel 10 will then be uppermost, but the apparatus case will not be particularly stable because it is leaning forward. A notch 19 may be included in the upper edge of tongue 13 to improve the stability, but it is more satisfactory to slide the apparatus case backwards so that pin 6 moves back along slot 8 and pin 5 moves over the entire upper edge of tongue 13 to drop into slot 8. The apparatus case can then be moved forward again to return pin 6 into notch 15, simultaneously locking pin 5 in slot 8 under tongue 13, as shown in FIG. 4.

To restore the apparatus case to its original position, it is only necessary to lift pin 6 out of notch 15 and slide it backwards until pin 5 clears tongue 13, and then downwards and backwards so that pin 6 moves to the rear of slot 8 and pin 7 enters notch 9.

It is preferable to use case telescopic slides which can be locked in their fully extended position, otherwise attempts to replace the apparatus into the position illustrated in FIG. 1 might result in the premature closing of the slides. Any suitable locking device can be used.

Figure 5B:
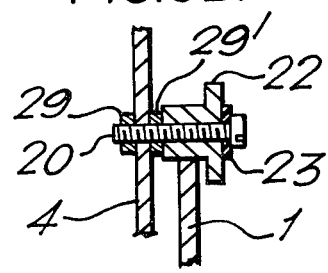
Figure 5C:
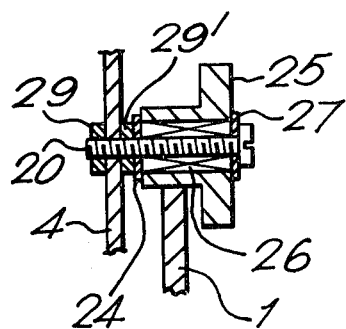
Figure 5D:
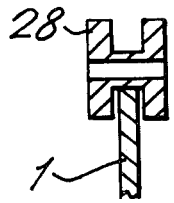

The pins 5, 6 and 7 may be constructed in a variety of ways. In the case of an apparatus case which is light in weight, then the form shown in FIG. 5A might be used, in which screw 20 holds a cylinder 21 on plate 4 and is secured by nut 29. Cylinder 21, which may be metal or a plastics material such as P.T.F.E. or nylon, may be flanged if desired. Alternatively, a metal cylinder 21 can be brazed, welded or riveted to plate 4. For more general application involving heavier apparatus, then a pulley or roller of the form shown in FIG. 5B is more suitable. Pulley 22 is mounted so that it is free to rotate on screw 20 which is fastened to plate 4 by nuts 29 and 29' and washer 23. For very heavy apparatus, a ball or roller bearing may be incorporated in the pulley, as shown in FIG. 5C. Screw 20, secured by nuts 29 and 29' to plate 4, carries pulley 25 between washers 24 and 27. A roller bearing 26 or the like is fitted to the centre of pulley 25. Alternatively, a smooth cylindrical pivot attached to plate 4 might be used, and the pulley 25 and bearing 26 secured to the pivot by means of a circlip or a split pin. Pulley 22 or 25 might also be shaped as pulley 28 in FIG. 5D to ensure that it cannot run off the edge of support plate 1.

Figure 5E:
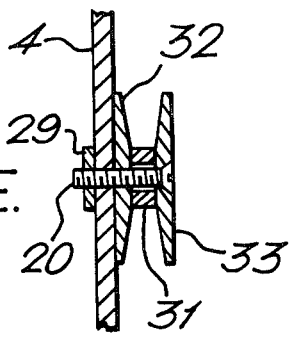

Another suitable form for the pins 5, 6 and 7 is illustrated in FIG. 5E. In this embodiment the cheeks 32 and 33 of the pulley are threaded on mounting screw 20 which is in turn secured to plate 4 by nut 29, so that cheeks 32 and 33 are fixed. Roller 31 is a clearance fit on screw 20 and is free to rotate between the cheeks 32 and 33. Various other forms of pulley or roller construction are also possible and will occur to those skilled in the art.

As mentioned above, when the apparatus to be supported is enclosed in a box or case, then plate 4 may conveniently form the side of the apparatus. However, if an open chassis with no sides is to be mounted, then the plate 4 must be separately provided and attached to the chassis. Alternatively, pins 6 and 7 could be secured to the side of the chassis and pin 5 supported on a suitably placed bracket. If a very thin chassis, or one consisting only of a flat plate is used, then it is of course possible to mount all three pins on brackets in place of the plate-like member 4.

Support plate 1 is preferably made from steel plate which is thick enough to carry the weight of the apparatus without bending or distortion, but other materials may also be used. It can also be made an integral part of the sliding member of telescopic slide 2 if desired.

The precise location of the slots and notches in support plate 1 and the positions of the pins 5, 6 and 7 on plate 4 are shown relatively in FIGS. 6 and 7 respectively. Referring first to FIG. 6, the distance between the centres of pins 6 and 7 is taken as x, and the position of pin 5 is defined in terms of y and z relative to the position of pin 6. The diameter of the pins or rollers is taken as p and shown in FIG. 6 as $\phi p$. The positions of the slots and notches in support plate 1 in terms of these dimensions is given in FIG. 7. Here the dimension d represents the distance through which it is desired to move the unit forward between the orientations shown in FIGS. 1 and 2, and e is the distance from the centre of the notch 14 to the front edge of support plate 1. The diameter of all the notches, and the width of the slots, should obviously be slightly greater than p. The length of tongue 13 must be greater than $(y+p)$ to ensure stability in the orientation shown in FIG. 4, but the distance from the rear end of slot 8 to the rear of tongue 13 should not be less than y otherwise it will be difficult to obtain this orientation. The distance between notch 15 and the front of support plate 1 must be less than $(x-p)$ to allow the apparatus to be swung down into the third orientation (FIG. 3), and pin 7 must be further than $(d+e)$ from panel 10 so that the normal position (FIG. 1) can be obtained. The length of slot 8 must be greater than $(d+e+p)$ in order to allow the unit to be moved forward sufficiently to allow pin 7 to clear the front end of support plate 1 when moving between the positions of FIGS. 2 and 3.

Within these limitations, and those of the fixed dimensions shown in FIGS. 6 and 7, the sizes and positions of the pins and notches may be varied to suit a particular application. In general it is best to keep x and y as large as possible to ensure the best stability, but y is limited by the need to allow both pins 5 and 6 to enter slot 8, and, of course, by the height of the apparatus to be mounted.

It will be appreciated that it is within the scope of the invention to shape the support plates 1 to allow only some of the orientations described, and that the pins and notches may be repositioned to allow other orientations to be achieved (for example, one which supported the unit at 45° to the support plate), if these are considered to be more suitable for a particular application.

What is claimed is:

1. Apparatus for mounting electrical equipment comprising an equipment case having a front panel, a rear panel and two side panels; said casing being mounted from a rack by two telescopic slides one disposed adjacent each said side panel permitting said case to be withdrawn from said rack on extension of said slides; each said slide comprising a fixed member attached to said rack and a sliding member comprising a rigid elongate support plate; each said support plate being provided with a generally horizontal top edge formed with a substantially horizontal slot opening at its rear end and terminating at its blind front end in a first downwardly formed notch; each said top edge having further formed therein second, third and fourth downwardly formed notches progressively forward of said first notch; each said side panel being provided with at least a first, a second and a third bearing pin each engageable with at least one of said notches in the adjacent slide, said pins retained in engagement with said notches by the action of gravity serving to support said case from said slides; said first pin being disposed forward of said second and third pins and in substantially the same horizontal plane as said second pin, and said third pin being disposed between said first and second pins, above said horizontal plane and nearer to said second pin than to said first pin; said pins, notches and slots being disposed to permit, when said slides are extended, said case to be moved by a lifting action sequentially between at least three orientations and in at least one of said orientations to be removed from engagement with said slides by lifting; and said at least three orientations comprising (a) a first orientation in which said case can be secured in said rack when said slides are closed and in which said first pin is engaged by said third notch and said second pin is disposed in said slot at the rear, upwardly open end thereof, (b) a second orientation in which the rear of said case is clear of said rack and in which said first pin is engaged by said fourth notch and said second pin is disposed part way along said slot, and (c) a third orientation in which the front panel of said case is downwardly directed and in which said third pin is engaged by said second notch and said second pin is engaged by said first notch.

2. Apparatus according to claim 1 in which said bearing pins further comprise rollers each rotatably amounted on a fixed axle attached to said case.

3. Apparatus according to claim 1 in which said bearing pins are provided with flanges disposed outside said support plates to prevent said support plates moving away from said case.

4. Apparatus according to claim 1 in which said second notch is deeper than said first, third and fourth notches.

5. Apparatus according to claim 1 in which the rearward edge of said second notch is formed as a rearwardly and upwardly inclined ramp from said notch to a raised edge above said slot along which ramp said third pin may slide whilst said case is being transferred from said third orientation to a fourth orientation in which said front panel is upwardly directed, said second pin is engaged by said first notch, and said third pin is disposed part way along said slot.

6. Apparatus according to claim 1 further comprising a guide fitted in said rack and above each said support plate to limit the upward movement of said rack when said slides are closed and said case is in said first orientation.

* * * * *